United States Patent
Kozaki (10) Patent No.: US 9,100,005 B2
(45) Date of Patent: Aug. 4, 2015

(54) OUTPUT CIRCUIT, SEMICONDUCTOR INTEGRATED CIRCUIT, RESONATING DEVICE, ELECTRONIC DEVICE, AND MOVING OBJECT

(71) Applicant: Seiko Epson Corporation, Tokyo (JP)

(72) Inventor: Minoru Kozaki, Fujimi-machi (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/219,533

(22) Filed: Mar. 19, 2014

(65) Prior Publication Data

US 2014/0292425 A1   Oct. 2, 2014

(30) Foreign Application Priority Data

Mar. 26, 2013   (JP) .................................. 2013-063668

(51) Int. Cl.
  *H03K 19/003*   (2006.01)
  *H03B 5/30*   (2006.01)

(52) U.S. Cl.
  CPC ............ *H03K 19/00384* (2013.01); *H03B 5/30* (2013.01)

(58) Field of Classification Search
  CPC .............................................. H03K 19/00384
  USPC ............................................. 331/74; 326/87
  See application file for complete search history.

(56) References Cited

U.S. PATENT DOCUMENTS

| 5,614,843 | A  |   | 3/1997  | Mita et al. |
| 5,751,180 | A  | * | 5/1998  | D'Addeo ....................... 327/379 |
| 7,489,205 | B2 | * | 2/2009  | Chatterjee et al. ............... 331/74 |
| 7,768,309 | B2 |   | 8/2010  | Luich |
| 8,536,951 | B2 | * | 9/2013  | Sareen ............................. 331/74 |
| 2001/0052791 | A1 |   | 12/2001 | Yoshizawa et al. |
| 2004/0061526 | A1 | * | 4/2004  | Amick et al. .................... 326/83 |
| 2007/0273407 | A1 | * | 11/2007 | Ueda ................................ 326/83 |
| 2009/0140768 | A1 |   | 6/2009  | Luich |

FOREIGN PATENT DOCUMENTS

JP   2001-320267 A   11/2001

* cited by examiner

*Primary Examiner* — Joseph Chang
(74) *Attorney, Agent, or Firm* — Harness, Dickey & Pierce, P.L.C.

(57) ABSTRACT

An output circuit includes a first circuit that generates a first output voltage based on a resistance ratio, on the basis of a reference voltage, a second circuit that compares the first output voltage with a source voltage of a second transistor that sets a second output voltage of the output signal, and generates an output gate voltage for causing the first transistor to output the second output voltage, and a third circuit that controls a timing at which the output gate voltage is applied to the first transistor, on the basis of an input control signal.

20 Claims, 9 Drawing Sheets

OUTPUT CIRCUIT, SEMICONDUCTOR INTEGRATED CIRCUIT, RESONATING DEVICE, ELECTRONIC DEVICE, AND MOVING OBJECT

BACKGROUND

1. Technical Field

The present invention relates to an output circuit, a semiconductor integrated circuit, a resonating device, an electronic device, a moving object, and the like.

2. Related Art

In recent years, there have been a large number of standards for performing serial communication at a high data rate. For example, PECL (Positive Emitter Coupled Logic), LVPECL (Low Voltage PECL) and the like have been used. There are also a large number of output circuits appropriate for these standards, which are used in integrated circuit devices (ICs) and the like. For example, PECL output circuits are used in integrated circuit devices including an oscillation circuit, and output a differential signal of PECL on the basis of an oscillation signal.

Generally, in the PECL output circuit, a bipolar type NPN transistor is used in an output transistor (see, for example, JP-A-2001-320267). The bipolar type transistor operates at high speed, and thus is suitable for high-speed serial transmission.

Such a PECL output circuit is required to be manufactured using a BiCMOS process. However, when a BiCMOS process is used, a process cost increases as compared with a MOS process, and as a result, the cost of the integrated circuit device itself including the PECL output circuit increases.

As disclosed in Specification of U.S. Patent Application Publication No. 2009/0140768, a MOS-type transistor is used as an output transistor (see, for example, FIG. 8B of Specification of U.S. Patent Application Publication No. 2009/0140768), and can be manufactured using a MOS process. However, when the MOS-type transistor is used, process variation (for example, approximately ±0.1 V) generally occurs in its threshold voltage. For this reason, it is difficult to adapt an output voltage of a PECL output circuit disclosed in Specification of U.S. Patent Application Publication No. 2009/0140768 to the standard of PECL.

SUMMARY

An advantage of some aspects of the invention is to make it possible to provide an output circuit, a semiconductor integrated circuit, a resonating device, an electronic device, a moving object, and the like which are capable of outputting a desired output voltage without being influenced by, for example, process variation while using a MOS-type output transistor.

The invention can be implemented as the following forms or application examples.

Application Example 1

This application example is directed to an output circuit that uses a MOS-type first transistor of which a drain terminal is supplied with a power supply voltage and which outputs an output signal from a source terminal thereof, as an output stage, the output circuit including: a first circuit that generates a first output voltage based on a resistance ratio, on the basis of a reference voltage; a second circuit that compares the first output voltage with a source voltage of a second transistor that sets a second output voltage of the output signal, and generates an output gate voltage for causing the first transistor to output the second output voltage; and a third circuit that controls a timing at which the output gate voltage is applied to the first transistor, on the basis of an input control signal.

The output circuit according to this application example uses a MOS-type first transistor having a source follower configuration as an output stage. The output circuit includes a first circuit that generates a first output voltage, a second circuit that generates an output gate voltage on the basis of the first output voltage and the replicated output voltage of the output signal, and a third circuit that controls the application of the output gate voltage to the first transistor on the basis of an input control signal. Meanwhile, the first transistor corresponds to the output transistor.

The first output voltage generated by the first circuit may be a voltage corresponding to a high level or a low level determined in, for example, the specification or the standard.

The output gate voltage generated by the second circuit is a voltage which is applied to the gate terminal of the first transistor. In this case, the output gate voltage is adjusted on the basis of the replicated output voltage of the output signal and the first output voltage. For example, the output gate voltage is adjusted so that a voltage difference therebetween is not present.

In this case, the second circuit includes a circuit used in the replication of the output voltage of the output signal, but the transistor of the circuit and the first transistor vary so as to be the same as each other. Therefore, the output voltage of the output signal can be set to the second output voltage (for example, voltage corresponding to a high level or a low level determined in the standard) regardless of process variation.

The third circuit can control the application of the output gate voltage to the first transistor on the basis of the input control signal, and output the second output voltage of, for example, a high level or a low level from the source terminal of the first transistor. Thus, the output circuit according to this application example can output a desired output voltage without being influenced by, for example, process variation while using a MOS-type first transistor. The third circuit may have a configuration in which, for example, a transmission gate is included, or may have a configuration in which, for example, an inverter, a buffer or the like that selectively outputs two output gate voltages is included.

Application Example 2

In the output circuit according to the application example described above, the second circuit may include a replica circuit of the first transistor.

Application Example 3

In the output circuit according to the application example described above, the replica circuit may include: a replica transistor of which a drain terminal is supplied with a power supply voltage; and a current source which is connected to a source terminal of the replica transistor, and the second circuit may generate a replica transistor adjustment voltage which is a gate voltage of the replica transistor so that a voltage of the source terminal of the replica transistor and the first output voltage are consistent with each other, and may set the replica transistor adjustment voltage to the output gate voltage.

Application Example 4

In the output circuit according to the application example described above, the replica circuit may include the replica transistor which is smaller in size than the first transistor.

The second circuit of the output circuit according to this application example may include the replica circuit of the first transistor. The second circuit includes the replica circuit of the first transistor, and thus can accurately replicate the output voltage of the output signal.

Here, the replica circuit may include a replica transistor of which the drain terminal is supplied with a power supply voltage, and a current source which is connected to the source terminal of the replica transistor. The replica transistor is a transistor obtained by replicating the first transistor, and may be a transistor having the same size. However, it is preferable that the replica transistor be a transistor obtained by reducing its size at a predetermined ratio. In this case, it is possible to reduce the power consumption of the replica circuit.

In addition, the current source is a source obtained by replicating a load circuit installed outside the output circuit. Even when the output circuit according to this application example is used as an output circuit of the standard (for example, PECL) in which a plurality of power supply voltages can be used, it is possible to expand the range of use by replicating a current independent of the power supply voltage.

The second circuit generates the replica transistor adjustment voltage which is a gate voltage of the replica transistor so that the voltage of the source terminal of the replica transistor and the second output voltage are consistent with each other. Here, the voltage of the source terminal of the replica transistor corresponds to the output voltage of the output signal. Therefore, the replica transistor adjustment voltage is set to the output gate voltage, and thus the output circuit according to this application example can output a desired output voltage accurately.

Application Example 5

In the output circuit according to the application example described above, the output signal may have at least one of a first level and a second level different from the first level, as a signal level, the first circuit may generate the first output voltage corresponding to the output signal of the first level and the second level, the second circuit may generate a first output gate voltage and a second output gate voltage which are the output gate voltage corresponding to the output signal of the first level and the second level, and the third circuit may select one of the first output gate voltage and the second output gate voltage on the basis of the input control signal, and apply the selected one to the first transistor.

Application Example 6

In the output circuit according to the application example described above, the number of output signals may be two or more.

Application Example 7

In the output circuit according to the application example described above, the output signal may be a differential output.

The output circuit according to this application example has a first level and a second level as a signal level of the output signal. The first level and the second level may correspond to, for example, a high level and a low level of a digital output signal, but are not limited thereto. In this case, the first circuit generates the first output voltage with respect to each of the first level and the second level. The second circuit generates a first output gate voltage and a second output gate voltage which are the output gate voltage corresponding to each of the first level and the second level, using two first output voltages.

The third circuit selects one of the first output gate voltage and the second output gate voltage on the basis of the input control signal, and applies the selected one to the first transistor. When the first output gate voltage is applied to the gate terminal of the first transistor, the output voltage of the output signal is changed to the second output voltage corresponding to the first level (for example, high level). In addition, when the second output gate voltage is applied to the gate terminal of the first transistor, the output voltage of the output signal is changed to the second output voltage corresponding to the second level (for example, low level). In this manner, the output circuit according to this application example can output a desired output voltage without being influenced by, for example, process variation with respect to each of a plurality of signal levels. Meanwhile, the number of the plurality of signal levels may be three or more.

The output circuit may output a plurality of output signals. These output signals may be differential outputs. For example, the output circuit may be a PECL output circuit, and may output two output signals of a non-inverted signal and an inverted signal. In addition, a plurality of such channels may be included. In this case, the output circuit according to this application example can output a desired output voltage without being influenced by, for example, process variation, and thus it is possible to realize a high-quality multi-output circuit and a differential output circuit.

Application Example 8

This application example is directed to a semiconductor integrated circuit including: the output circuit according to the application example described above; and an oscillation circuit that oscillates an oscillation element to generate an oscillation signal, wherein the output circuit sets the oscillation signal to the input control signal.

Application Example 9

This application example is directed to a resonating device including: the semiconductor integrated circuit according to the application example described above; and the oscillation element.

According to the semiconductor integrated circuit and the resonating device of these application examples, an oscillation circuit and the output circuit are included, and thus it is possible to generate an output signal (hereinafter, also referred to as a clock signal) based on an oscillation signal from the oscillation circuit. Therefore, the semiconductor integrated circuit and the resonating device according to this application example are able to output the clock signal of a desired output voltage without being influenced by process variation. Meanwhile, the vibration device may be a device that detects a physical quantity, and may output a physical quantity signal of a desired output voltage, and the like.

Application Example 10

This application example is directed to an electronic device including the semiconductor integrated circuit according to the application example described above.

Application Example 11

This application example is directed to a moving object including the semiconductor integrated circuit according to the application example described above.

According to the electronic device and the moving object of these application examples, the semiconductor integrated circuit is included, and thus it is possible to use a clock signal of a desired output voltage, or the like which is not influenced by process variation. Therefore, it is possible to realize an electronic device and a moving object with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying drawings. Meanwhile, by the embodiments described below, the disclosure of the invention described in the appended claims is not unduly limited. In addition, all the configurations described below are not necessarily the essential components of the invention.

Figure 1:
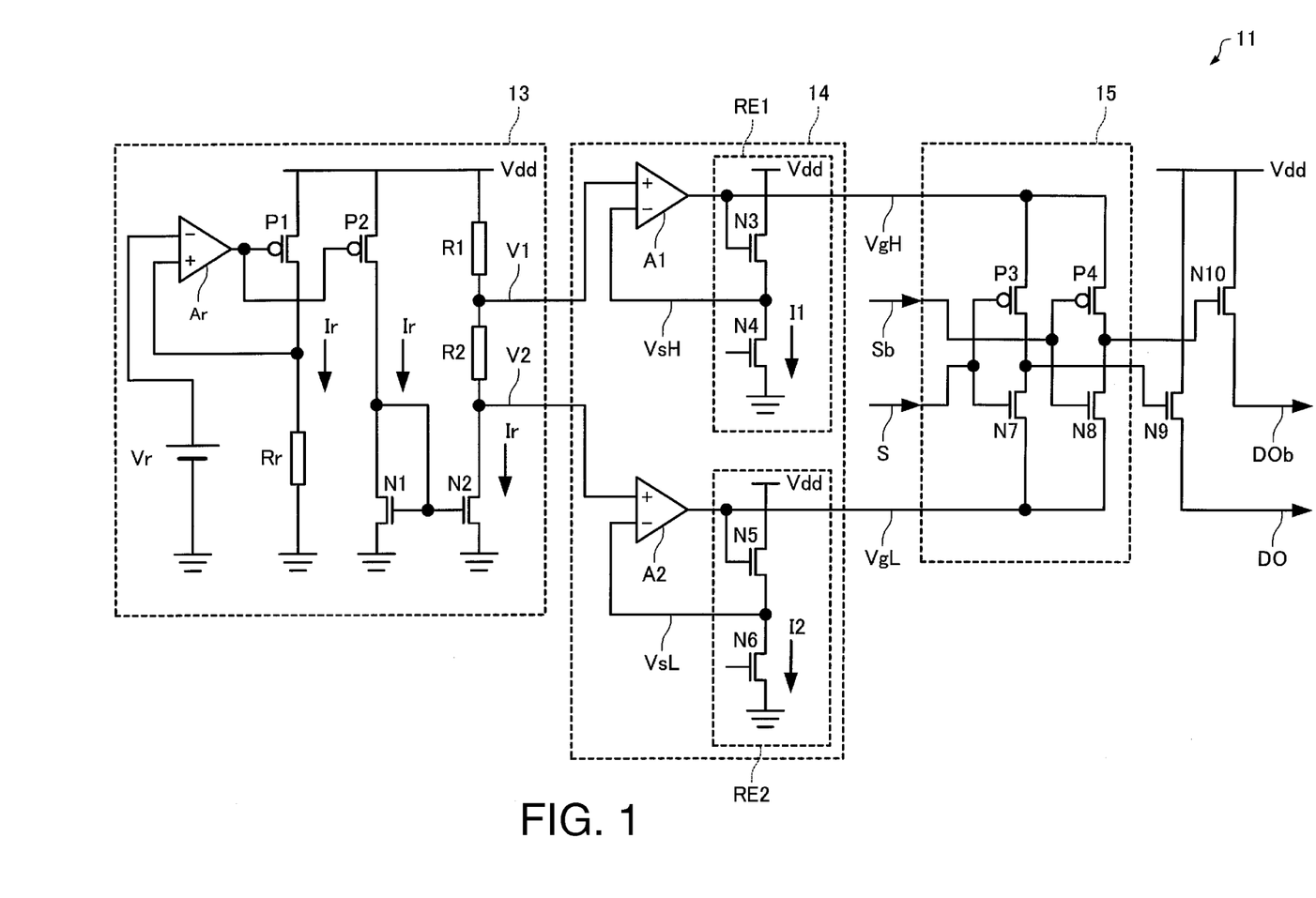
FIG. 1 is a diagram illustrating a configuration example of an output circuit according to an embodiment.

1. Output Circuit and Semiconductor Integrated Circuit Configuration of Output Circuit FIG. 1 is a diagram illustrating a configuration example of an output circuit 11 according to an embodiment. The output circuit 11 constitutes an output stage of a semiconductor integrated circuit 10 described later, and outputs a non-inverted output signal DO and an inverted output signal DOb which are differential output signals of PECL (Positive Emitter Coupled Logic) on the basis of a non-inverted oscillation signal S and an inverted oscillation signal Sb. Meanwhile, the non-inverted oscillation signal S and the inverted oscillation signal Sb correspond to an input control signal according to the invention, and the non-inverted output signal DO and the inverted output signal DOb correspond to an output signal according to the invention. Meanwhile, in the following, when it is not necessary to discriminate between the non-inverted output signal DO and the inverted output signal DOb, these signals are simply represented as an "output signal of the output circuit 11".

The output circuit 11 includes MOS-type output transistors N9 and N10 of which the drain terminals are supplied with a power supply voltage Vdd, and which output the non-inverted output signal DO and the inverted output signal DOb, respectively, from the source terminals thereof. In addition, the output circuit 11 includes a first circuit 13, a second circuit 14, and a third circuit 15. The output transistors N9 and N10 correspond to a first transistor according to the invention.

The first circuit 13 generates first output voltages V1 and V2 of the output signal of the output circuit 11. The first output voltages V1 and V2 are voltages of the high level and the low level of the differential output signal, respectively, based on the standard of PECL. The output signal of the output circuit 11 is required to take the first output voltage V1 or the first output voltage V2, without being influenced by, for example, process variation. Hereinafter, the configuration of the first circuit 13 will be described.

As shown in FIG. 1, the first circuit 13 includes a stable reference voltage Vr. The reference voltage Vr can be realized using, for example, a band-gap reference circuit and the like. An error amplifier Ar of the first circuit 13 adjusts the gate voltage of a transistor P1 to maintain a balance in a state where voltages of an inverting input terminal and a non-inverting input terminal are substantially equal to each other. For this reason, a current Ir flowing to the transistor P1 can be expressed as in Expression (1) when a resistance value of a resistor (hereinafter, resistor Rr) connected to the transistor P1 is set to Rr.

$$Ir = \frac{Vr}{Rr} \qquad (1)$$

A transistor P2 of FIG. 1 has the same shape as that of transistor P1, and the current Ir also flows to the transistor P2. In addition, the transistor N1 which is connected to the transistor P2 and the transistor N2 form a current mirror. In this case, a mirror ratio is 1, and the current Ir also flows to the transistor N2. Meanwhile, the mirror ratio may be other than 1.

Since the current Ir flows to a resistor (hereinafter, resistor R1) having a resistance value of R1, and a resistor (hereinafter, resistor R2) having a resistance value of R2, which is connected in series to the transistor N2, a voltage drop is generated. That is, the first circuit 13 generates the first output voltage V1 of a high level and the first output voltage V2 of a low level which are determined in the standard of PECL. The first output voltages V1 and V2 are given by the following Expression (2) and Expression (3).

$$V1 = Vdd - R1 \times Ir = Vdd - \frac{R1}{Rr} \times Vr \qquad (2)$$

$$V2 = V1 - R2 \times Ir = V1 - \frac{R2}{Rr} \times Vr \qquad (3)$$

Since the first output voltages V1 and V2 are based on the power supply voltage Vdd, the stable reference voltage Vr, and the resistance ratio between the resistor Rr, the resistor R1 and the resistor R2, it is possible to obtain high accuracy without being influenced by process variation. That is, since the resistor Rr, the resistor R1, and the resistor R2 vary so as to be the same as each other, the first output voltages V1 and V2 based on a resistance ratio therebetween are not influenced by process variation.

Next, the second circuit 14 replicates an output voltage of the output signal of the output circuit 11. Output gate voltages VgH and VgL, which are gate voltages of the output transistors N9 and N10, are generated on the basis of the first output voltages V1 and V2 and the replicated output voltage. That is, the second circuit 14 generates the output gate voltages VgH and VgL that cause the output transistors N9 and N10 (corresponding to the first transistor according to the invention) to output an output voltage (corresponding to a second output voltage according to the invention). Hereinafter, the configuration of the second circuit 14 will be described.

The second circuit 14 receives the first output voltage V1 of a high level and the first output voltage V2 of a low level from the first circuit 13. The second circuit generates the output gate voltage VgH by which the output voltage of the output signal of the output circuit 11 is set to the first output voltage V1. In addition, the second circuit also generates the output gate voltage VgL by which the output voltage of the output signal of the output circuit 11 is set to the first output voltage V2.

For example, when the output gate voltage VgH is applied to the gate terminal of the output transistor N9, the output voltage of the non-inverted output signal DO is set to the first output voltage V1 (of which the signal level is a high level). In this case, the output gate voltage VgL is applied to the gate terminal of the output transistor N10, and thus the output voltage of the inverted output signal DOb is set to the first output voltage V2 (of which the signal level is a low level). Here, since the output transistors N9 and N10 have the same shape dimensions, the second circuit 14 is not required to generate the output gate voltages VgH and VgL with respect to each of the output transistors N9 and N10.

The second circuit 14 includes replica circuits RE1 and RE2 obtained by replicating the output transistor N9 and the output transistor N10. The output voltage of the output signal of the output circuit 11 is replicated by the replica circuits RE1 and RE2. The replica circuit RE1 is used for generating the output gate voltage VgH, and the replica circuit RE2 is used for generating the output gate voltage VgL.

The replica circuit RE1 includes a replica transistor N3 (corresponding to a second transistor according to the invention) of which the drain terminal is supplied with the power supply voltage Vdd, and a current source N4 which is connected to the source terminal of the replica transistor N3. The replica transistor N3 replicates the output transistor N9 (and the output transistor N10). In addition, the current source N4 is a source obtained by replicating a load circuit (see FIGS. 3A and 3B) installed outside the output circuit 11. Meanwhile, the current source N4 of the present embodiment uses a constant current of the transistor which operates in saturation.

Here, the replica transistor N3 is smaller in size than the output transistor N9 and the output transistor N10. The small size means that specifically, the size ratio, that is, the ratio of (gate width/gate length) is small. For example, the gate length L0 (see FIGS. 4A and 4B) of the replica transistor N3 is set to be the same as those of the output transistor N9 and the output transistor N10. On the other hand, the gate width W0 (see FIGS. 4A and 4B) of the replica transistor N3 may be designed to be smaller than those of the output transistor N9 and the output transistor N10, and the size ratio may be set to be, for example, approximately one out of tens.

In this case, the output voltage of the output signal of the output circuit 11 can be accurately replicated by the replica circuit RE1 obtained by replicating the output transistor N9 and the output transistor N10, and the current I1 of the replica circuit RE1 can be reduced depending on the size ratio. Therefore, it is possible to reduce power consumption in the replica circuit RE1.

The second circuit 14 can replicate the output voltage of the output signal of the output circuit 11 when a high level is taken, using a voltage (hereinafter, source voltage VsH) of the source terminal of the replica transistor N3. The second circuit 14 detects a difference between the source voltage VsH and the first output voltage V1 using an error amplifier A1. As shown in FIG. 1, an output of the error amplifier A1 is set to a gate voltage (replica transistor adjustment voltage according to the invention) of the replica transistor N3. By the source voltage VsH being fed back to the error amplifier A1, the source voltage VsH and the first output voltage V1 finally become equal to each other, and the output of the error amplifier A1 (that is, replica transistor adjustment voltage) in this case is set to the output gate voltage VgH.

In this case, the source voltage VsH of the replica transistor N3 of which the gate terminal is supplied with the output gate voltage VgH is equal to the first output voltage V1 of a high level. Then, since the replica circuit RE1 is a circuit obtained by replicating the output transistor N9 and the output transistor N10, the source voltage VsH corresponds to the output voltages of the non-inverted output signal DO and the inverted output signal DOb. For this reason, when the output gate voltage VgH is applied to the gate terminals of the output transistors N9 and N10, the output voltages of the non-inverted output signal DO and the inverted output signal DOb become equal to the first output voltage V1.

The replica circuit RE2 has the same structure as that of the replica circuit RE1, and thus the description thereof will not be given. That is, in the description of the replica circuit RE1, the replica transistor N3, the current source N4, the current I1, the source voltage VsH, the error amplifier A1, the first output voltage V1, and the output gate voltage VgH are replaced by a replica transistor N5, a current source N6, a current I2, a source voltage VsL, an error amplifier A2, a first output voltage V2, and output gate voltage VgL, respectively, which results in the description of the replica circuit RE2. Meanwhile, the replica transistor N5 corresponds to the second transistor according to the invention.

Meanwhile, the replica circuit RE2 is independent of the replica circuit RE1, and the size ratio, for example, with respect to the output transistor N9 and the output transistor N10 may be different between the replica circuit RE2 and the replica circuit RE1. For example, the size ratio of the replica transistor N3 may be 1/60, and the size ratio of the replica transistor N5 may be 1/15.

The third circuit 15 controls the application of the output gate voltages VgH and VgL to the output transistors N9 and N10 on the basis of the non-inverted oscillation signal S and the inverted oscillation signal Sb. Hereinafter, the configuration of the third circuit 15 will be described.

As shown in FIG. 1, the third circuit 15 includes a changeover switch (hereinafter, referred to as a first changeover switch) constituted by transistors P3 and N7 and a changeover switch (hereinafter, referred to as a second changeover switch) constituted by transistors P4 and N8. Both the first changeover switch and the second changeover switch output the output gate voltage VgH or the output gate voltage VgL.

The first changeover switch applies the output gate voltage VgH or output gate voltage VgL to the gate terminal of the output transistor N9, in accordance with the signal level of the input non-inverted oscillation signal S. In addition, the second changeover switch applies the output gate voltage VgH or the output gate voltage VgL to the gate terminal of the output transistor N10, in accordance with the signal level of the input inverted oscillation signal Sb.

In this case, the non-inverted oscillation signal S and the inverted oscillation signal Sb have signal levels different from each other. When the non-inverted oscillation signal S has, for example, a low level, the inverted oscillation signal Sb has a high level. In this case, the output gate voltage VgH is applied to the gate terminal of the output transistor N9, and thus the output voltage of the non-inverted output signal DO becomes equal to the first output voltage V1. The output gate voltage VgL is applied to the gate terminal of the output transistor N10, and thus the output voltage of the inverted output signal DOb becomes equal to the first output voltage V2. Here, the first output voltages V1 and V2 are voltages of the high level and the low level of the differential output signal, respectively, based on the standard of PECL. In this manner, the output circuit 11 can output the differential output signal of PECL, on the basis of the input control signal (non-inverted oscillation signal S and inverted oscillation signal Sb).

Meanwhile, in the present embodiment, although the differential output signal is output, the inverted output signal DOb, for example, may be omitted, and a single-ended output from the non-inverted output signal DO may be performed. In this case, the second changeover switch constituted by the transistors P4 and N8 and the inverted oscillation signal Sb are also omitted.

Configuration of Semiconductor Integrated Circuit

Figure 2:
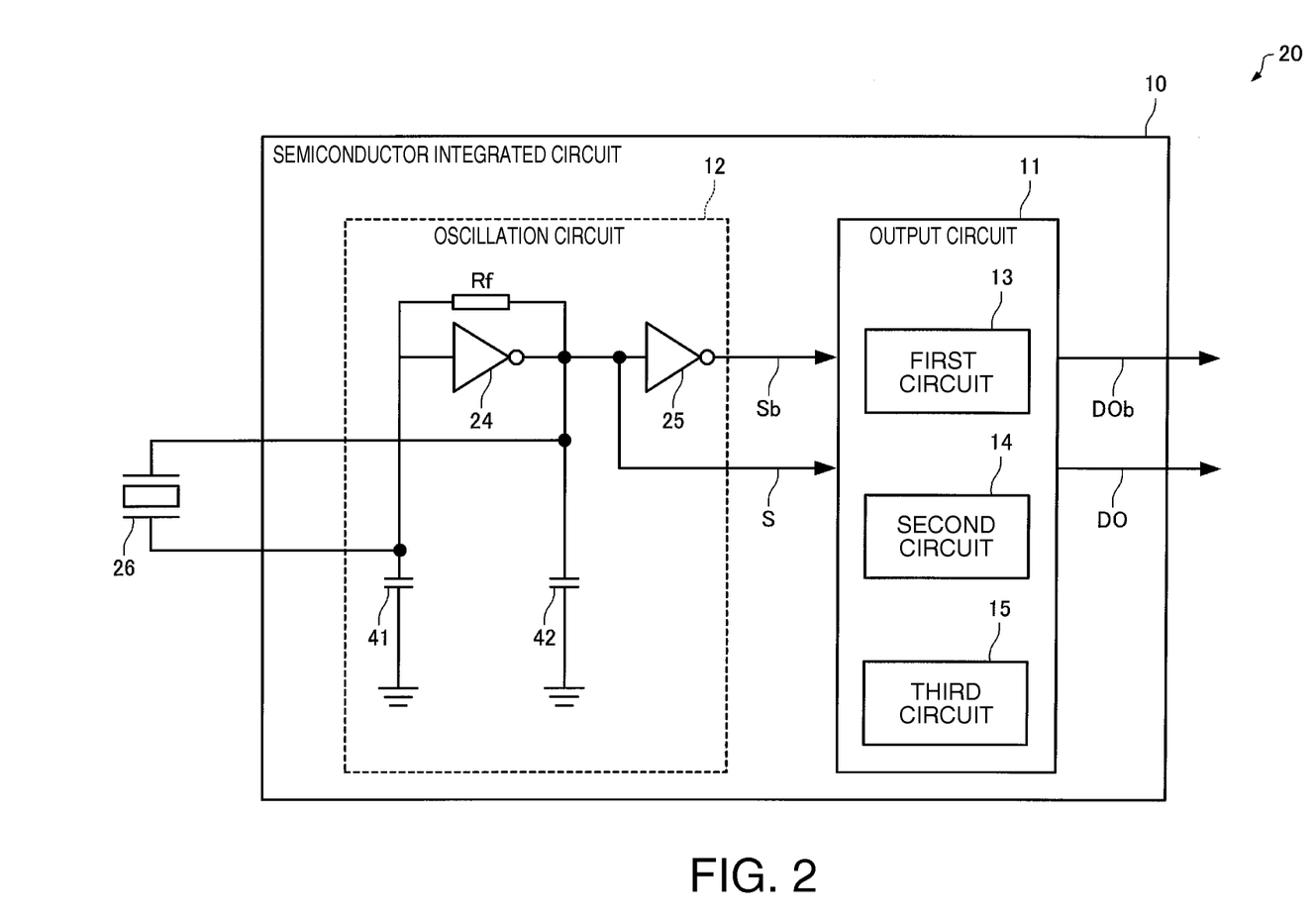
FIG. 2 is a diagram in which a semiconductor integrated circuit including the output circuit according to the embodiment and an oscillation circuit is connected to an oscillation element.

FIG. 2 is a diagram illustrating a state where the semiconductor integrated circuit 10 including the output circuit 11 and an oscillation circuit 12 is connected to a quartz crystal resonator 26 (corresponding to an oscillation element according to the invention). As shown in FIG. 2, the output circuit 11 is used as the output stage of the semiconductor integrated circuit 10. Meanwhile, the same components as those in FIG. 1 are denoted by the same reference numerals and signs, and thus the description thereof will not be given.

The output circuit 11 is formed in one chip together with the oscillation circuit 12 that generates an oscillation signal (here, non-inverted oscillation signal S and inverted oscillation signal Sb) by oscillating the quartz crystal resonator 26, and constitutes the semiconductor integrated circuit 10. In addition, the semiconductor integrated circuit is connected to the quartz crystal resonator 26, and constitutes a quartz crystal oscillator 20 on which temperature compensation or temperature control is not performed, that is, an SPXO (Simple Packaged Crystal Oscillator).

The oscillation circuit 12 includes an inverter 24 provided with a feedback resistor Rf functioning as an analog amplifier, and fixed capacitors 41 and 42. As shown in FIG. 2, the oscillation circuit is connected to the quartz crystal resonator 26 to form an oscillation loop. In addition, the oscillation circuit 12 includes an inverter 25, and outputs not only the non-inverted oscillation signal S but also the inverted oscillation signal Sb, as oscillation signals. The output circuit 11 receives these signals, and outputs the non-inverted output signal DO and the inverted output signal DOb which are differential output signals of PECL.

Figure 3A:
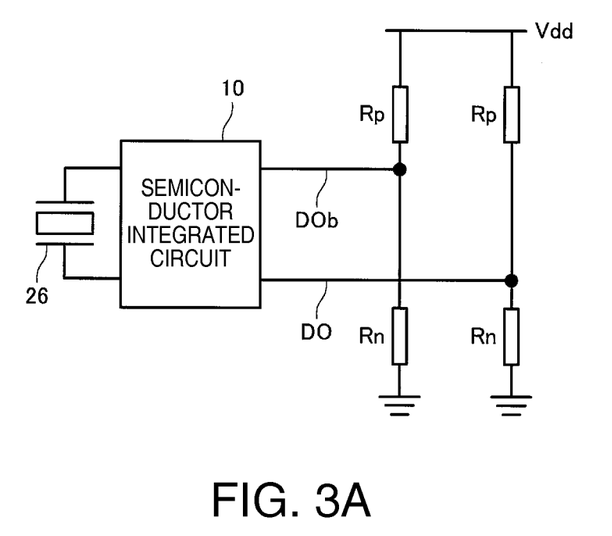
FIGS. 3A and 3B are diagrams illustrating a termination circuit.
Figure 3B:
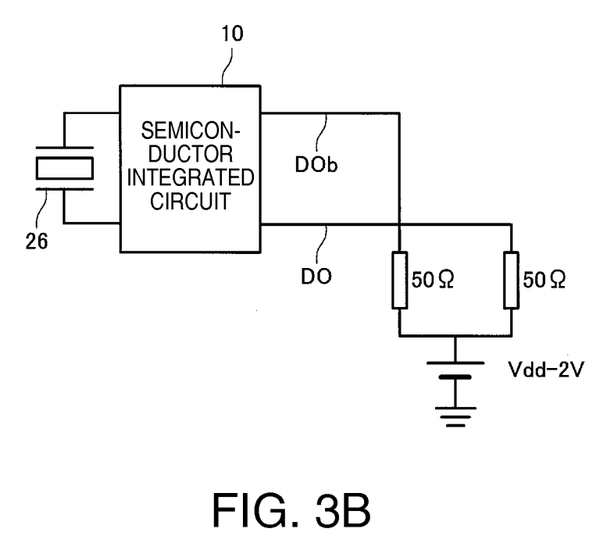

Here, a termination circuit is added to a differential output of PECL. FIGS. 3A and 3B are diagrams illustrating the termination circuit. As shown in FIGS. 3A and 3B, the semiconductor integrated circuit 10 including the output circuit 11 of the present embodiment is added with the termination circuit in the outside thereof.

PECL does not require a negative power supply unlike ECL (Emitter Coupled Logic), and Vdd-2V (voltage which is lower by 2 V than the power supply voltage Vdd) which is a positive voltage is used as a termination voltage. As shown in FIG. 3B, it is required to perform termination at 50Ω on the termination voltage.

However, a Thevenin termination circuit as shown in FIG. 3A is often used without separately preparing Vdd-2V as the termination voltage. In this case, resistance values Rp and Rn are set to satisfy the following Expression (4) and Expression (5), and thus electric characteristics can be set to be the same as those in FIG. 3B.

$$Vdd \times \frac{Rn}{Rp + Rn} = Vdd - 2V \quad (4)$$

$$\frac{Rp \times Rn}{Rp + Rn} = 50\Omega \quad (5)$$

Comparison with Output Circuit of the Related Art

Figure 9:
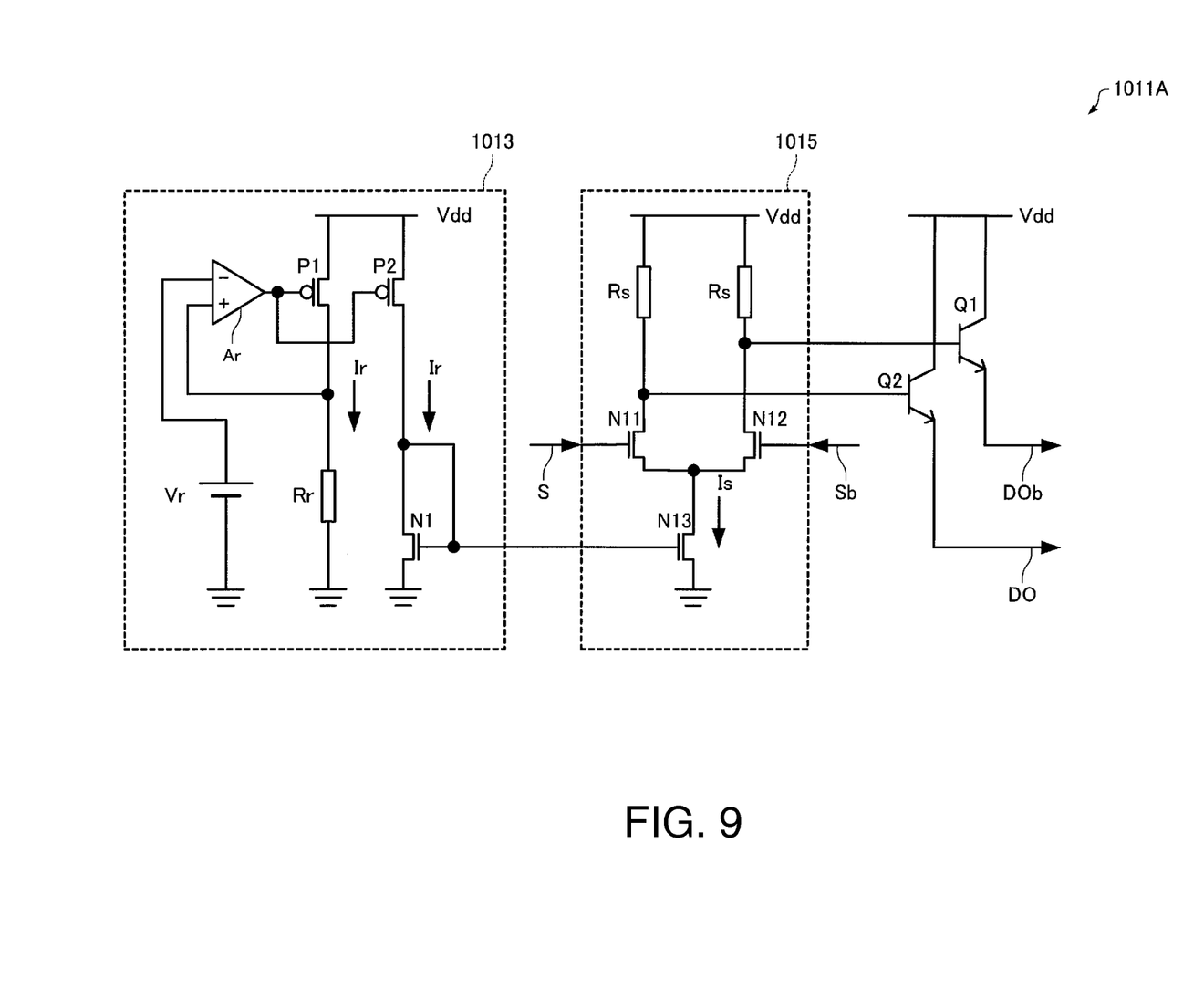
FIG. 9 is a circuit diagram illustrating an example of an output circuit of the related art.

Here, on the assumption that the output circuit 11 of the present embodiment is used as the output stage of the semiconductor integrated circuit 10 as mentioned above, comparison with output circuits 1011A and 1011B of the related art is performed. FIG. 9 is a circuit diagram illustrating the output circuit 1011A of the related art. In the output circuit 1011A, NPN transistors Q1 and Q2 are used as output transistors. Meanwhile, the same components as those in FIGS. 1 to 3B are denoted by the same reference numerals and signs, and thus the description thereof will not be given.

The output circuit 1011A includes a pre-stage circuit 1013 and a post-stage circuit 1015. The pre-stage circuit 1013 corresponds to the first circuit 13 of the output circuit 11 according to the present embodiment, but does not include a circuit (circuit constituted by the resistor R1, the resistor R2, and the transistor N2) that generates the first output voltages V1 and V2.

A transistor N13 of the post-stage circuit 1015 forms a current mirror with a transistor N1 of the pre-stage circuit 1013. A current Is flows to the transistor N13, and the relation of Is=n×Ir is established using Ir of Expression (1). Here, n is a mirror ratio, and is determined by the ratio of a gate width between the transistor N1 and the transistor N13. Meanwhile, the gate lengths thereof are assumed to be the same as each other.

Transistors N11 and N12 of the post-stage circuit 1015 function as switches. The non-inverted oscillation signal S and the inverted oscillation signal Sb (see FIG. 2) are input to the gate terminals of the transistors N11 and N12, respectively. Since the non-inverted oscillation signal S and the inverted oscillation signal Sb are differential signals, the transistors N11 and N12 repeat turn-on and turn-off alternately.

In this case, since the base voltages of the NPN transistors Q1 and Q2 of the output circuit 1011A are changed, the output voltages of a high level and a low level appear alternately in the output signal (non-inverted output signal DO and inverted output signal DOb) of the output circuit 1011A. Here, the output voltage of a high level is represented by VoH, and the output voltage of a low level is represented by VoL. VoH and VoL are expressed by Expression (6) and Expression (7), respectively, assuming that the post-stage circuit 1015 includes resistors having a resistance value Rs.

$$VoH \approx Vdd - VbeH \quad (6)$$

$$VoL \approx Vdd - Rs \times Is - VbeL \quad (7)$$

Here, VbeH and VbeL are base-emitter voltages of the output transistors (NPN transistor Q1 and NPN transistor Q2) in a high level and a low level, respectively. In the standard of PECL, VoH and VoL are required to be in ranges of Expression (8) and Expression (9), respectively.

$$VoH = Vdd - 0.9525V \pm 0.0725V \quad (8)$$

$$VoL=Vdd-1.715V\pm0.095V \quad (9)$$

In the output circuit 1011A of the related art, the resistance value Rs, the current Is, and VbeH and VbeL which are base-emitter voltages are adjusted so as to satisfy Expression (8) and Expression (9).

Here, based on Expression (8) and Expression (9), an output current of the output signal (non-inverted output signal DO and inverted output signal DOb) of the output circuit 1011A is examined. As shown in FIG. 3B, since termination at an impedance of 50Ω is performed on the termination voltage of Vdd-2V, IoH which is the output current of a high level and IoL which is the output current of a low level are required to be in ranges of Expression (10) and Expression (11), respectively.

$$IoH=(VoH-Vdd+2)/50=20.95 \text{ mA}\pm1.45 \text{ mA} \quad (10)$$

$$IoL=(VoL-Vdd+2)/50=5.7 \text{ mA}\pm1.9 \text{ mA} \quad (11)$$

VoH and VoL are dependent on the power supply voltage Vdd as in Expression (8) and Expression (9). However, Expression (10) and Expression (11) lose the term of Vdd when Expression (8) and Expression (9) are substituted into Expression (10) and Expression (11), and it is found that IoH and IoL are independent of the power supply voltage Vdd.

The output circuit 1011A of the related art adjusts the resistance value Rs, the current Is, and VbeH and VbeL which are base-emitter voltages, and thus it is possible to satisfy Expression (8) and Expression (9) representing the standard of PECL. However, since the NPN transistors Q1 and Q2 are used as output transistors, it is necessary to manufacture the transistors using a BiCMOS process. For this reason, a process cost increases as compared with a MOS process, and as a result, the cost of an integrated circuit device including the output circuit 1011A increases.

Figure 10:
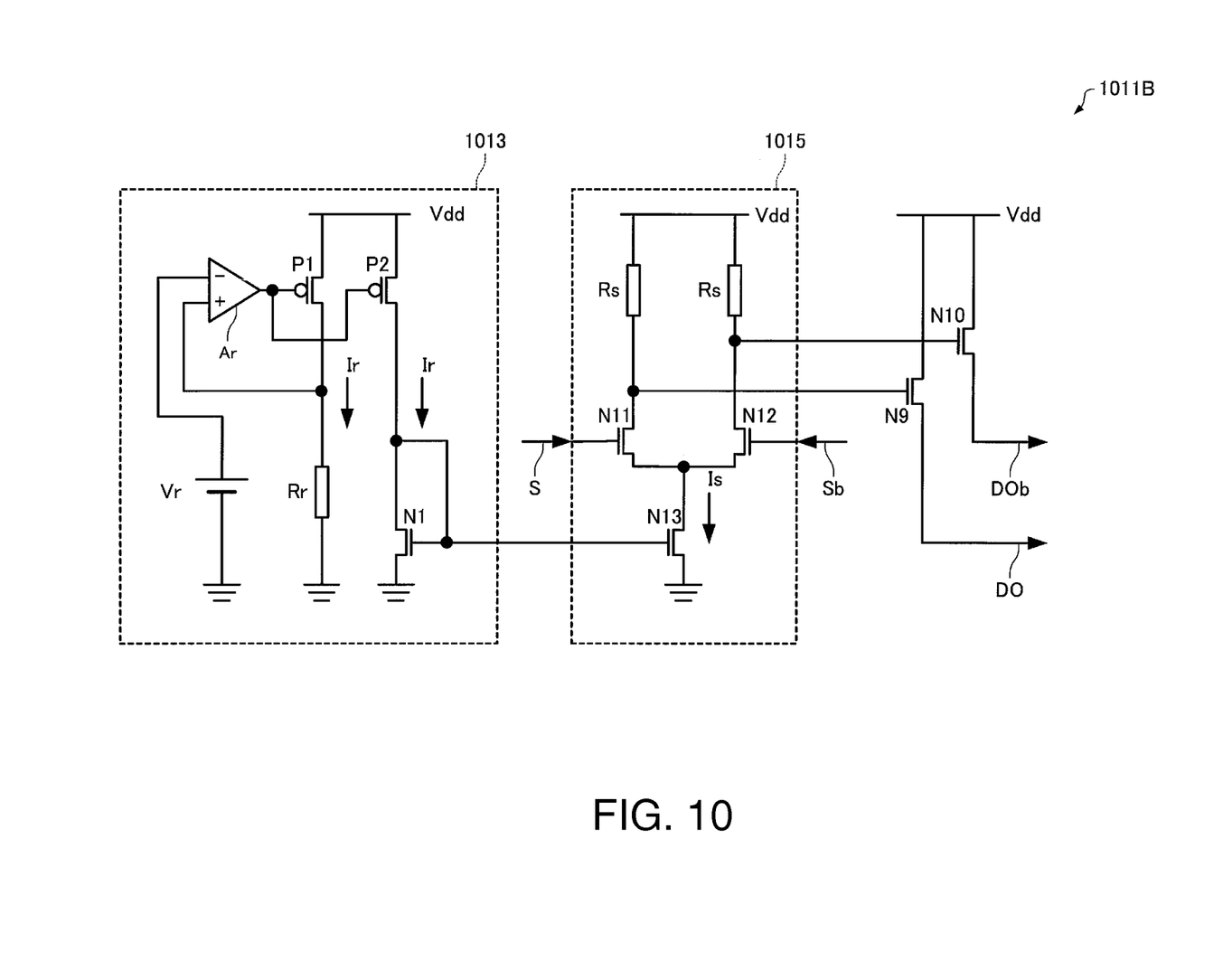
FIG. 10 is a circuit diagram illustrating another example of the output circuit of the related art.

Consequently, as shown in FIG. 10, it is considered to use the output circuit 1011B in which the NPN transistors Q1 and Q2 of the output circuit 1011A are replaced by the MOS-type output transistors N9 and N10. The output circuit 1011B is a circuit of the related art which is different from the output circuit 1011A, is constituted by only a MOS-type transistor, and can be manufactured using an inexpensive MOS process. Meanwhile, the pre-stage circuit 1013 and the post-stage circuit 1015 are the same as those in FIG. 9, and thus the description thereof will not be given.

However, in the output circuit 1011B, it is difficult to satisfy the ranges (Expression (8) and Expression (9)) of VoH and VoL required in the standard of PECL. VoH which is the output voltage of a high level and VoL which is the output voltage of a low level in the output circuit 1011B are expressed by Expression (12) and Expression (13), respectively.

$$VoH=Vdd-VgsH \quad (12)$$

$$VoL=Vdd-Rs\times Is-VgsL \quad (13)$$

Here, VgsH and VgsL are gate-source voltages of the MOS-type output transistors (output transistor N9 and output transistor N10) at a high level and a low level, respectively. In the output circuit 1011B, it is also considered that the resistance value Rs, the current Is, and VgsH and VgsL which are gate-source voltages should be adjusted so as to satisfy Expression (8) and Expression (9). That is, it is considered that VgsH and VgsL which are gate-source voltages should be adjusted, instead of VbeH and VbeL which are base-emitter voltages.

However, VgsH and VgsL of the MOS-type transistor are given by the sum of a threshold voltage Vth and an overdrive voltage. The threshold voltage Vth has a large process variation, and thus it is required to make allowance for the variation of, for example, approximately ±0.1 V. Then, the variation of the threshold voltage Vth exceeds an allowable fluctuation range shown in Expression (8) and Expression (9), and thus the output circuit 1011B is not able to satisfy the standard of PECL.

In this case, measures to perform non-defective product sorting of the output circuit 1011B so that the variation of the threshold voltage Vth is within the allowable fluctuation range, or to reduce the variation of the threshold voltage Vth by restricting a manufacturing apparatus are considered. However, either of the measures causes an increase in manufacturing costs, and thus benefits of cost reduction through manufacturing using a MOS process are lost.

Further, in the output circuit 1011B, the threshold voltage Vth of the output transistors (output transistor N9 and output transistor N10) also fluctuates depending on a body effect. The body effect is a phenomenon in which the threshold voltage Vth increases as a source-bulk voltage is higher, and is a phenomenon specific to the MOS-type transistor. As shown in FIG. 10, the voltages of the source terminals of the output transistors (output transistor N9 and output transistor N10) are equivalent to either of the output voltage VoH of a high level or the output voltage VoL of a low level, but VoH and VoL are dependent on the power supply voltage Vdd as in Expression (12) and Expression (13). For this reason, the threshold voltage Vth also fluctuates depending on the power supply voltage Vdd. Thus, when the output circuit 1011B is used at a plurality of power supply voltages (for example, 2.5 V and 3.3 V), it is very difficult to satisfy Expression (8) and Expression (9) with respect to each of the power supply voltages. For this reason, the, range of use is limited with respect to the selection of the power supply voltage.

In addition, the threshold voltage Vth also fluctuates depending on temperature. The threshold voltage Vth tends to be lowered as temperature is higher. For this reason, in order to satisfy Expression (8) and Expression (9), such a restriction that the output circuit 1011B has to be brought into operation, for example, only in the vicinity of specific temperature is caused.

As stated above, the output circuit 1011B of the related art can be manufactured using a MOS process, whereas the threshold voltage Vth is influenced by a PVT fluctuation, that is, a fluctuation in process, a fluctuation in voltage (body effect), and a fluctuation in temperature. For this reason, it is difficult to satisfy Expression (8) and Expression (9), and thus the output circuit 1011B is not used in reality.

Here, referring to FIG. 1 again, the output circuit 11 of the present embodiment will be described. The first circuit 13 of the output circuit 11 generates the first output voltages V1 and V2. The first output voltages V1 and V2 can be determined by the stable reference voltage Vr and the resistance ratio between the resistor Rr, the resistor R1, and the resistor R2, as in Expression (2) and Expression (3).

The first circuit 13 can set central values of VoH and VoL shown in Expression (8) and Expression (9) to the first output voltages V1 and V2. For example, in a case of reference voltage Vr=1.25 V, the relations of R1/Rr=0.762 and R2/Rr=0.61 are established. In this case, it is possible to establish the relations of first output voltage V1=Vdd-0.9525 V and first output voltage V2=Vdd-1.715 V. In this case, since the first output voltages V1 and V2 are determined by the resistance ratio between the resistor Rr, the resistor R1, and the resistor R2, it is possible to obtain high accuracy without being influenced by, for example, process variation.

In addition, the second circuit 14 of the output circuit 11 replicates the output voltage of the output signal of the output circuit 11 by the replica circuits RE1 and RE2. The first output voltages V1 and V2 and the replicated output voltage are made consistent with each other by the error amplifiers A1 and A2, and thus the output gate voltages VgH and VgL, which are the gate voltages of the output transistors N9 and N10, are generated.

Here, the replica transistors N3 and N5 included in the replica circuits RE1 and RE2 accurately replicate the MOS-type output transistors (output transistors N9 and N10) of the output circuit 11. For this reason, the PVT fluctuation of the MOS-type output transistors of the output circuit 11 influences the replica transistors N3 and N5 likewise. Therefore, since the output circuit 11 can set the output voltage of the output signal constantly to the first output voltage V1 or the first output voltage V2, the output circuit satisfies Expression (8) and Expression (9), and can be used as a PECL output circuit.

Meanwhile, as mentioned above, the replica transistors N3 and N5 are smaller in size than the output transistor of the output circuit 11, and thus reduce the power consumption of the output circuit 11. That is, the replica transistors N3 and N5 do not have the same size as that of the output transistor of the output circuit 11. For this reason, it is preferable to perform a layout as described below.

Figure 4A:
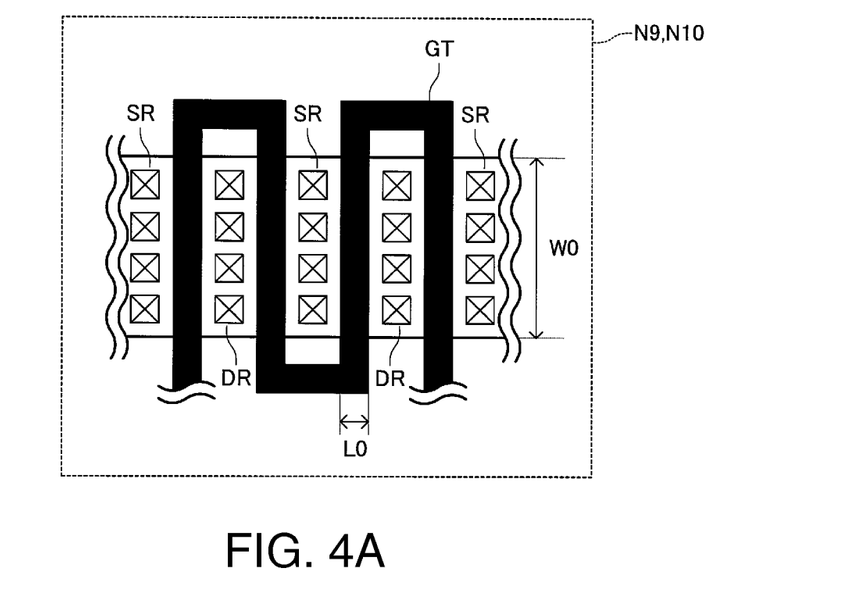
FIGS. 4A and 4B are diagrams illustrating a design of a replica circuit.

For example, the output transistors N9 and N10 are assumed to be formed in a layout as shown in FIG. 4A. Here, SR of FIG. 4A is a source, and DR is a drain. In addition, regarding a gate GT, the gate length thereof is L0, and the gate width thereof is an integral multiple (here, which is set to M×W0 using an integer M) of W0.

Figure 4B:
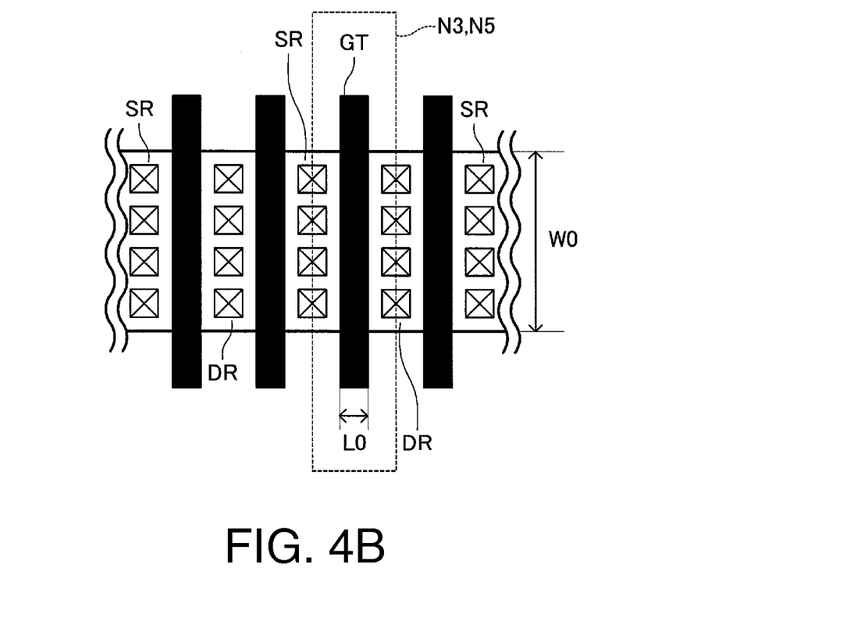

In this case, the replica transistors N3 and N5 are formed in a layout as shown in FIG. 4B. The gate lengths of the replica transistors N3 and N5 are L0 likewise, but the gate widths thereof are W0, and the size ratio is 1/M as compared with the output transistors N9 and N10. That is, the replica transistors N3 and N5 are merely one transistor surrounded by the frame of FIG. 4B, and the other transistors are not used as a transistor. However, the replica transistors N3 and N5 replicate the layout of the output transistors N9 and N10 including unused portions, and thus even the influence of the PVT fluctuation is accurately reflected.

In addition, the replica circuits RE1 and RE2 use the current sources N4 and N6 in order to replicate a load circuit (see FIGS. 3A and 3B) installed outside the output circuit 11. Here, as in Expression (10) and Expression (11), IoH and IoL are independent of the power supply voltage Vdd. For this reason, the replica circuits RE1 and RE2 that replicate IoH and IoL by the currents I1 and I2 are used, and thus Expression (8) and Expression (9) can be satisfied even when the power supply voltage is changed. That is, in the output circuit 11, it is possible to expand the range of use without limiting the power supply voltage.

Meanwhile, high accuracy is not required for the currents I1 and I2 of the replica circuits RE1 and RE2. The current I1 may target, for example, 0.35 mA corresponding to 1/60 of 20.95 mA (see Expression (10)) which is a desired current value of IoH. In addition, the current I2 may target, for example, 0.38 mA corresponding to 1/15 of 5.7 mA (see Expression (11)) which is a desired current value of IoL. When the current values of the currents I1 and I2 deviate from the target, deviation also occurs in the overdrive voltages of the replica transistors N3 and N5. However, when the gate widths of the output transistors N9 and N10 are made large enough, VgsH and VgsL are dominated by threshold voltage Vth, and thus the deviation of the overdrive voltage can be ignored. For this reason, high accuracy is not required for the currents I1 and I2.

As stated above, the output circuit 11 of the present embodiment can be manufactured by an inexpensive MOS process unlike the output circuit 1011A of the related art, and there is no problem that the output voltage significantly deviates from the first output voltages V1 and V2 due to the influence of the PVT fluctuation unlike the output circuit 1011B of the related art. That is, the output circuit 11 of the present embodiment can output a desired output voltage without being influenced by the PVT fluctuation while using the MOS-type output transistor. In addition, in the output circuit 11 of the present embodiment, it is possible to expand the range of use without limiting the power supply voltage.

2. Resonating Device

A resonating device 200 of the present embodiment includes an output circuit 211, an oscillation circuit 212, and an oscillation element 230 oscillated by the oscillation circuit 212. The output circuit 211 and the oscillation circuit 212 may be included in the resonating device 200 as a semiconductor integrated circuit 210. In the description of the resonating device 200 of the present embodiment, the output circuit 211 corresponds to the output circuit 11 of FIGS. 1 and 2, the oscillation circuit 212 corresponds to the oscillation circuit 12 of FIG. 2, and the semiconductor integrated circuit 210 corresponds to the semiconductor integrated circuit 10 of FIGS. 2 to 3B. Meanwhile, the oscillation circuit 212 of a temperature compensated oscillator described later is assumed to include a circuit that performs temperature compensation in addition to the configuration of the oscillation circuit 12 of FIG. 2.

The resonating device 200 includes, for example, an oscillator provided with a vibrator as the oscillation element 230, a physical quantity sensor provided with an oscillation type sensor element 240 as the oscillation element 230, and the like.

Figure 5A:
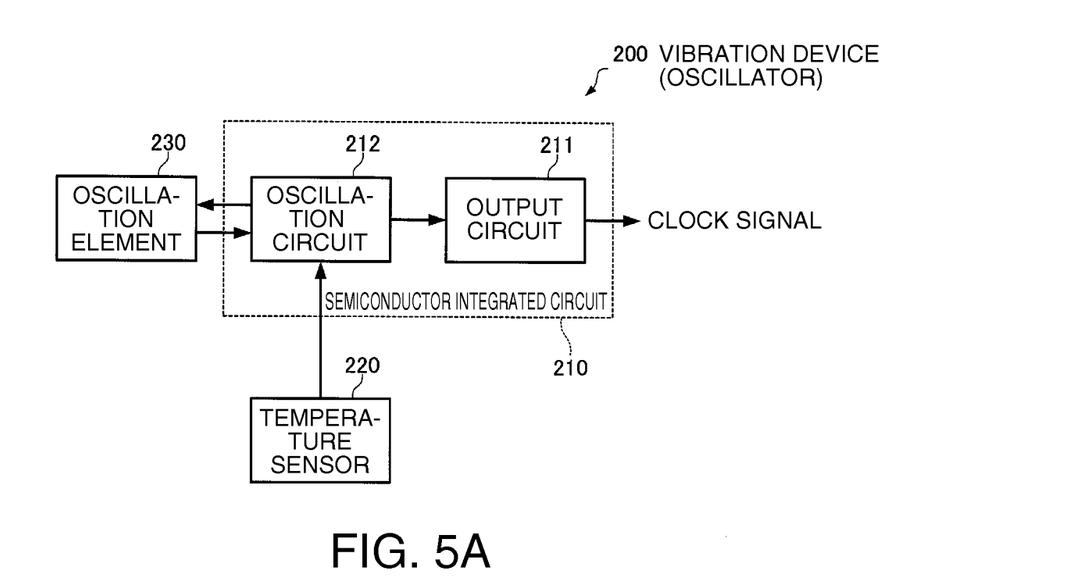
FIGS. 5A and 5B are diagrams illustrating a configuration example of a resonating device.

FIG. 5A shows a configuration example of an oscillator which is an example of the resonating device 200. The resonating device 200 (oscillator) shown in FIG. 5A is a temperature compensated oscillator, and includes the output circuit 211, the oscillation circuit 212, a temperature sensor 220, and the oscillation element 230. Here, the output circuit 211 and the oscillation circuit 212 may constitute the semiconductor integrated circuit 210.

The oscillation circuit 212 generates a frequency control voltage Vc according to an output of the temperature sensor 220 in the inside thereof to thereby change the capacitance value of a variable capacitive element in response to a temperature change, and performs oscillation at a constant frequency while compensating for the frequency temperature characteristics of the oscillation element 230 (corresponding to, for example, the quartz crystal resonator 26 of FIGS. 2 to 3B). The obtained oscillation signal is output as a clock signal by the output circuit 211. Here, the output circuit 211 may output a clock signal which is a differential signal (see FIG. 1).

Example of the oscillator which is a resonating device of the present embodiment include a voltage controlled oscillator (such as VCXO or VCSO), a voltage controlled temperature compensated oscillator (VC-TCXO), a oven controlled oscillator (such as OCXO), and the like, in addition to the temperature compensated oscillator. In addition, the oscillator may be SPXO which does not include the temperature sensor 220 and does not perform temperature compensation. That is, the quartz crystal oscillator 20 of FIG. 2 is an example of the resonating device 200.

Figure 5B:
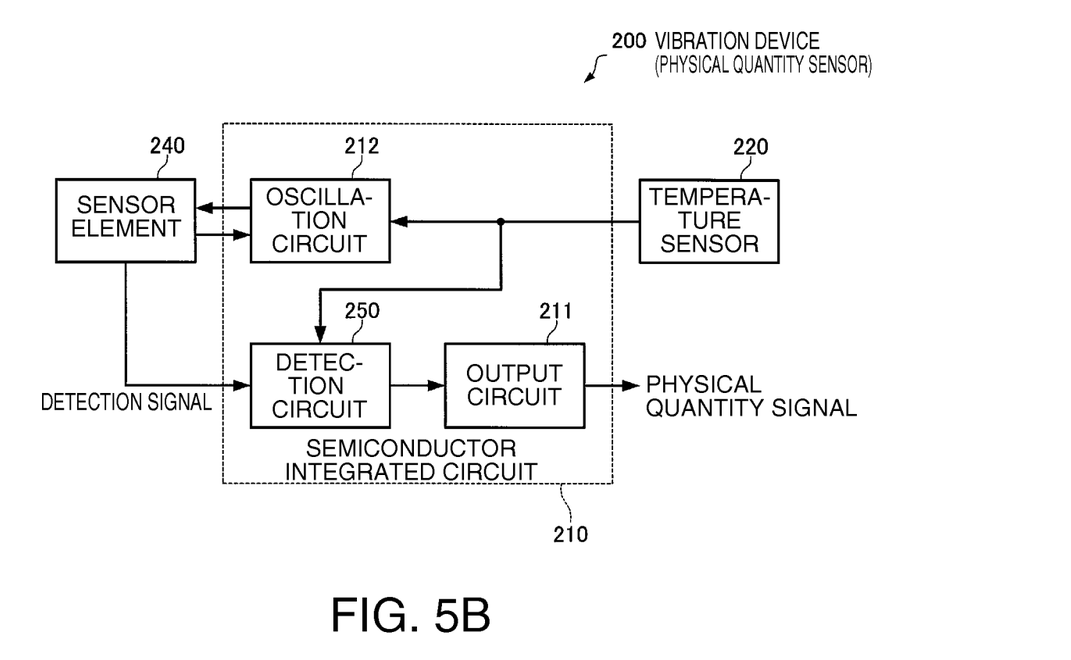

FIG. 5B shows a configuration example of a physical quantity sensor which is an example of the resonating device. The resonating device 200 (physical quantity sensor) shown in FIG. 5B includes the output circuit 211, the oscillation circuit 212, the temperature sensor 220, the sensor element 240 formed of quartz crystal or the like as a material, and a detection circuit 250. Here, the output circuit 211, the oscillation circuit 212, and the detection circuit 250 may constitute the semiconductor integrated circuit 210.

The oscillation circuit 212 generates the frequency control voltage Vc according to an output of the temperature sensor 220 in the inside thereof to thereby change the capacitance value of a variable capacitive element in response to a temperature change, and performs oscillation at a constant frequency while compensating for the frequency temperature characteristics of the sensor element 240.

The sensor element 240 outputs a detection signal depending on the magnitude of physical quantity (for example, angular velocity, acceleration or the like) applied while vibrating at a constant frequency.

The detection circuit 250 performs the detection or DC conversion of the detection signal of the sensor element 240, and generates a physical quantity signal of a signal level depending on the magnitude of the physical quantity applied to the sensor element 240. The generated physical quantity signal is output by the output circuit 211. Here, the output circuit 211 may output a physical quantity signal which is a differential signal (see FIG. 1).

Meanwhile, the detection circuit 250 may compensate for the temperature characteristics of the circuit element and the temperature characteristics of the sensor element 240, in accordance with the output of the temperature sensor 220, and may adjust the resonating level of the physical quantity signal.

The physical quantity sensor which is a resonating device of the present embodiment includes an angular velocity sensor (gyro sensor), an acceleration sensor, or the like.

According to the present embodiment, the resonating device 200 outputs a clock signal, a physical quantity signal and the like using the output circuit 211 of the semiconductor integrated circuit 210. Therefore, it is possible to output a clock signal of a desired output voltage, a physical quantity signal and the like without being influenced by process variation.

3. Electronic Device

An electronic device 300 of the present embodiment will be described with reference to FIGS. 6 and 7. Meanwhile, the same components as those of FIGS. 1 to 5B are denoted by the reference numerals and signs, and thus the description thereof will not be given.

Figure 6:
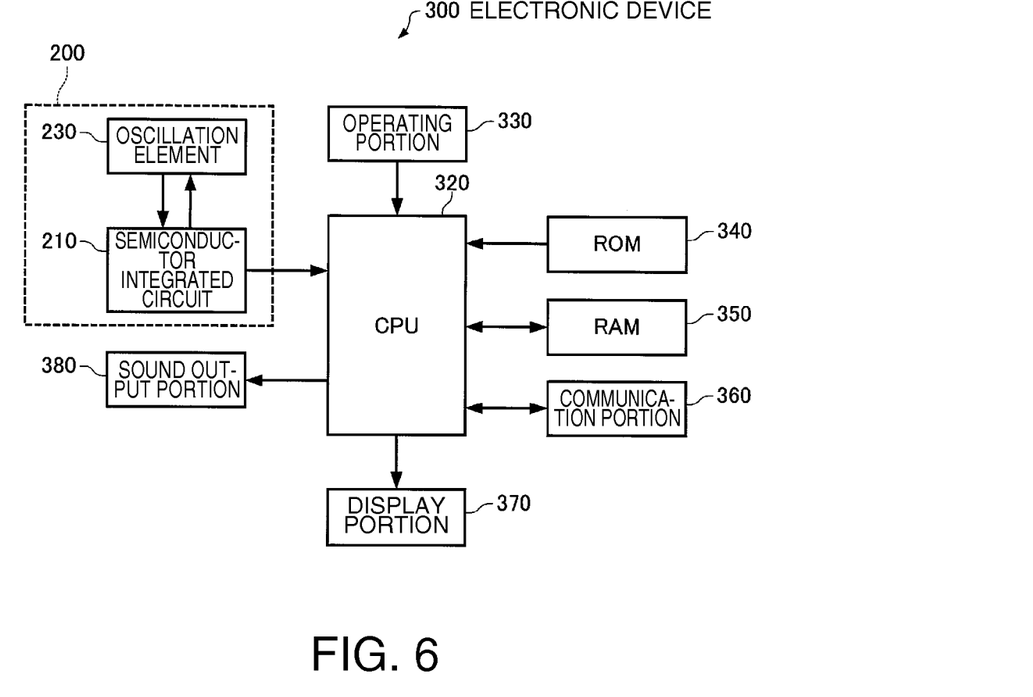
FIG. 6 is a functional block diagram of an electronic device.

FIG. 6 is a functional block diagram of the electronic device 300. The electronic device 300 includes the resonating device 200 having the semiconductor integrated circuit 210 and the oscillation element 230, a CPU (Central Processing Unit) 320, an operating portion 330, a ROM (Read Only Memory) 340, a RAM (Random Access Memory) 350, a communication portion 360, a display portion 370, and a sound output portion 380. Meanwhile, the electronic device 300 may have a configuration in which some of the components (the respective portions) of FIG. 6 are omitted or changed, or may have a configuration in which other components are added.

The resonating device 200 corresponds to the oscillator in which the semiconductor integrated circuit 210 and the oscillation element 230 are connected to each other (see FIG. 5A). Meanwhile, in FIG. 6, the temperature sensor 220 is not shown. The resonating device 200 supplies a clock signal from the output circuit 211 included in the semiconductor integrated circuit 210 not only to the CPU 320 but also to the respective portions (not shown in the drawing).

The CPU 320 performs various types of computation processes and control processes using the clock signal which is output by the resonating device 200, in accordance with a program stored in the ROM 340 or the like. Specifically, the CPU 320 performs various types of processes in response to an operation signal from the operating portion 330, a process of controlling the communication portion 360 in order to perform data communication with the outside, a process of transmitting a display signal for causing the display portion 370 to display a variety of information, a process of causing the sound output portion 380 to output various types of sounds, and the like.

The operating portion 330 is an input device constituted by operation keys, button switches or the like, and outputs an operation signal to the CPU 320 in response to a user's operation.

The ROM 340 stores a program, data or the like for causing the CPU 320 to perform various types of computation processes and control processes.

The RAM 350 is used as a work area of the CPU 320, and temporarily stores a program and data which are read out from the ROM 340, data which is input from the operating portion 330, arithmetic operation results executed by the CPU 320 in accordance with various types of programs, and the like.

The communication portion 360 performs a variety of controls for establishing data communication between the CPU 320 and an external device.

The display portion 370 is a display device constituted by an LCD (Liquid Crystal Display) or the like, and displays a variety of information on the basis of a display signal which is input from the CPU 320.

The sound output portion 380 is a device, such as a speaker, which outputs a sound.

The electronic device 300 receives a clock signal from the output circuit 211 included in the semiconductor integrated circuit 210, and thus it is possible to use a clock signal of a desired output voltage which is not influenced by process variation. Therefore, the electronic device 300 can enhance the reliability of an operation.

The electronic device 300 is considered to be diverse. Examples of the electronic device include network server, a personal computer (for example, mobile-type personal computer, laptop personal computer, and tablet personal computer), a mobile terminal such as a cellular phone, a digital still camera, an ink jet ejecting apparatus (for example, ink jet printer), a storage area network device such as a router or a switch, a local area network device, a television, a video camera, a video tape recorder, a car navigation device, a pager, an electronic notebook (also including a communication function), an electronic dictionary, an electronic calculator, an electronic game console, a game controller, a word processor, a workstation, a TV phone, a security TV monitor, an electronic binoculars, a POS terminal, a medical instrument (for example, electronic thermometer, sphygmomanometer, blood glucose monitoring system, electrocardiogram measurement device, ultrasound diagnostic device, and electronic endoscope), a fish finder, various types of measuring apparatuses, meters and gauges (for example, meters and gauges of a vehicle, an aircraft, and a vessel), a flight simulator, a head mounted display, a motion trace, motion tracking, a motion controller, PDR (Pedestrian Dead Reckoning), and the like.

Figure 7:
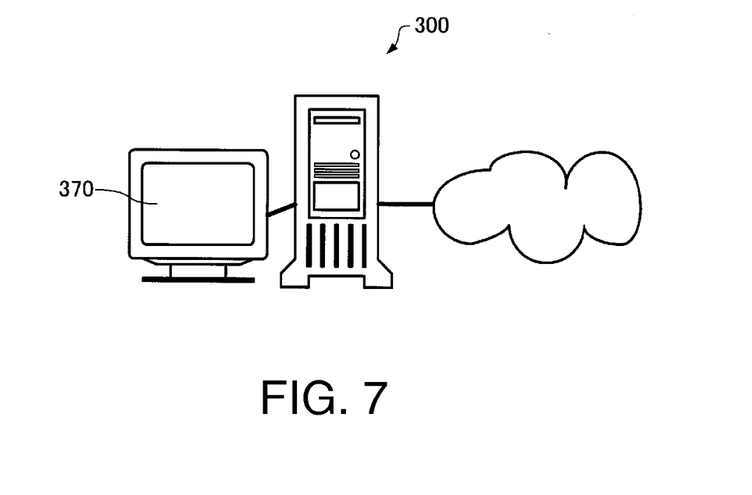
FIG. 7 is a diagram illustrating an example of the appearance of an electronic device.

FIG. 7 is a diagram illustrating an example of the appearance of a network server which is an example of the electronic device 300. The network server which is the electronic device 300 includes an LCD as the display portion 370. The network server which is the electronic device 300 receives a clock signal from the output circuit 211 included in the semiconductor integrated circuit 210, and thus it is possible to use a clock signal of a desired output voltage which is not influenced by process variation. Therefore, the network server can enhance the reliability of an operation.

4. Moving Object

A moving object 400 of the present embodiment will be described with reference to FIG. 8.

Figure 8:
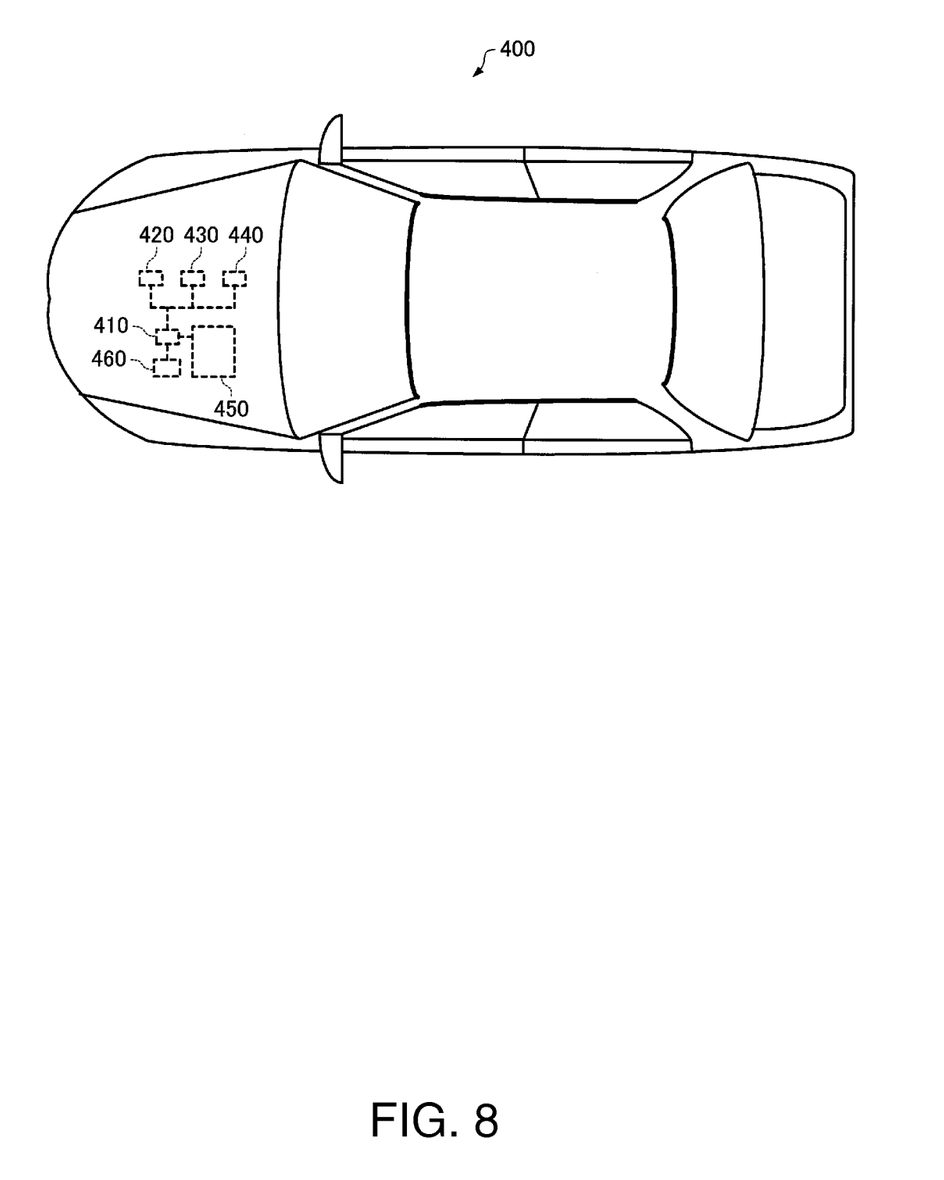
FIG. 8 is a diagram illustrating an example of a moving object.

FIG. 8 is a diagram (top view) illustrating an example of the moving object 400 according to the present embodiment. The moving object 400 shown in FIG. 8 includes an oscillation portion 410, controllers 420, 430, and 440 that perform a variety of controls of an engine system, a brake system, a keyless entry system and the like, a battery 450, and a backup battery 460. Meanwhile, the moving object of the present embodiment may have a configuration in which some of the components (the respective portions) of FIG. 8 are omitted or changed, and may have a configuration in which other components are added.

The oscillation portion 410 corresponds to the resonating device 200 (oscillator) including the semiconductor integrated circuit 210. The detailed description of other components will not be given, but high reliability is required in order to perform control required for the movement of the moving object. For example, it is possible to enhance reliability by including the backup battery 460 in addition to the battery 450.

Here, the system of the moving object 400 can use a clock signal of a desired output voltage from the oscillation portion 410, that is, the resonating device 200 (oscillator) including the semiconductor integrated circuit 210 which is not influenced by process variation. Thus, the moving object 400 can also enhance reliability with respect to an operation of the system.

Meanwhile, various moving objects are considered as such a moving object 400. Examples of the moving object include an automobile (also including an electric automobile), an aircraft such as a jet engine airplane or a helicopter, a vessel, a rocket, a satellite, and the like.

5. Others

The invention includes configurations (for example, configurations having the same functions, methods and results, or configurations having the same objects and effects) which are substantially the same as the configurations described in the above embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application No. 2013-063668 filed Mar. 26, 2013 is expressly incorporated by reference herein.

What is claimed is:

1. An output circuit that uses a MOS-type first transistor of which a drain terminal is supplied with a power supply voltage and which outputs an output signal from a source terminal thereof, as an output stage, the output circuit comprising:

a first circuit that generates a first output voltage based on a resistance ratio, on the basis of a reference voltage;

a second circuit that compares the first output voltage with a source voltage of a second transistor that sets a second output voltage of the output signal, and generates an output gate voltage for causing the first transistor to output the second output voltage; and a third circuit that controls a timing at which the output gate voltage is applied to the first transistor, on the basis of an input control signal.

2. The output circuit according to claim 1, wherein the second circuit includes a replica circuit of the first transistor.

3. The output circuit according to claim 2, wherein the replica circuit includes:

a replica transistor of which a drain terminal is supplied with a power supply voltage; and a current source which is connected to a source terminal of the replica transistor, and the second circuit generates a replica transistor adjustment voltage which is a gate voltage of the replica transistor so that a voltage of the source terminal of the replica transistor and the first output voltage are consistent with each other, and sets the replica transistor adjustment voltage to the output gate voltage.

4. The output circuit according to claim 3, wherein the replica circuit includes the replica transistor which is smaller in size than the first transistor.

5. The output circuit according to claim 1, wherein the output signal has at least one of a first level and a second level different from the first level, as a signal level, the first circuit generates the first output voltage corresponding to the output signal of the first level and the second level, the second circuit generates a first output gate voltage and a second output gate voltage which are the output gate voltages corresponding to the output signals of the first level and the second level, and the third circuit selects one of the first output gate voltage and the second output gate voltage on the basis of the input control signal, and applies the selected one to the first transistor.

6. The output circuit according to claim 1, wherein the number of output signals is two or more.

7. The output circuit according to claim 1, wherein the output signal is a differential output.

8. A semiconductor integrated circuit comprising:
the output circuit according to claim 1; and
an oscillation circuit that oscillates an oscillation element to generate an oscillation signal,
wherein the output circuit sets the oscillation signal to the input control signal.

9. A semiconductor integrated circuit comprising:
the output circuit according to claim 2; and
an oscillation circuit that oscillates an oscillation element to generate an oscillation signal,
wherein the output circuit sets the oscillation signal to the input control signal.

10. A semiconductor integrated circuit comprising:
the output circuit according to claim 3; and
an oscillation circuit that oscillates an oscillation element to generate an oscillation signal,
wherein the output circuit sets the oscillation signal to the input control signal.

11. A semiconductor integrated circuit comprising:
the output circuit according to claim 4; and an oscillation circuit that oscillates an oscillation element to generate an oscillation signal, wherein the output circuit sets the oscillation signal to the input control signal.

12. A resonating device comprising:
the semiconductor integrated circuit according to claim 8; and
the oscillation element.

13. A resonating device comprising:
the semiconductor integrated circuit according to claim 9; and
the oscillation element.

14. A resonating device comprising:
the semiconductor integrated circuit according to claim 10; and
the oscillation element.

15. An electronic device comprising the semiconductor integrated circuit according to claim 8.

16. An electronic device comprising the semiconductor integrated circuit according to claim 9.

17. An electronic device comprising the semiconductor integrated circuit according to claim 10.

18. A moving object comprising the semiconductor integrated circuit according to claim 8.

19. A moving object comprising the semiconductor integrated circuit according to claim 9.

20. A moving object comprising the semiconductor integrated circuit according to claim 10.

* * * * *